US008995147B2

(12) United States Patent
Liu et al.

(10) Patent No.: US 8,995,147 B2
(45) Date of Patent: Mar. 31, 2015

(54) CONNECTION ASSEMBLY AND ELECTRONIC DEVICE

(75) Inventors: Lei Liu, Shenzhen (CN); Guo-Yi Chen, Shenzhen (CN)

(73) Assignee: Zhongshan Innocloud Intellectual Property Services Co., Ltd., Zhongshan (CN)

( * ) Notice: Subject to any disclaimer, the term of this patent is extended or adjusted under 35 U.S.C. 154(b) by 262 days.

(21) Appl. No.: 13/517,551

(22) Filed: Jun. 13, 2012

(65) Prior Publication Data

US 2013/0203270 A1 Aug. 8, 2013

(30) Foreign Application Priority Data

Feb. 4, 2012 (CN) .......................... 2012 1 0024194

(51) Int. Cl.
*H05K 7/00* (2006.01)
*H01R 13/70* (2006.01)
*H01R 31/06* (2006.01)
*H01R 12/71* (2011.01)

(52) U.S. Cl.
CPC .............. *H01R 13/70* (2013.01); *H01R 12/716* (2013.01); *H01R 31/065* (2013.01)
USPC ........................................... 361/781; 361/785

(58) Field of Classification Search
USPC ......... 361/784, 785, 788, 789, 803, 807, 760, 361/781; 439/55, 68, 70, 330, 620.2, 525
See application file for complete search history.

(56) References Cited

U.S. PATENT DOCUMENTS

| | | | | |
|---|---|---|---|---|
| 6,453,014 | B1 * | 9/2002 | Jacobson et al. | 379/26.01 |
| 7,007,109 | B2 * | 2/2006 | Sivertsen | 710/15 |
| 7,273,391 | B2 * | 9/2007 | Purwin | 439/502 |
| 7,275,935 | B2 * | 10/2007 | Chen et al. | 439/61 |
| 7,490,176 | B2 * | 2/2009 | Lee | 710/17 |
| 7,612,631 | B2 * | 11/2009 | Hsu et al. | 333/24 R |
| 7,624,203 | B2 * | 11/2009 | Blinick et al. | 710/16 |
| 7,627,709 | B2 * | 12/2009 | Bacom et al. | 710/315 |
| 2005/0028028 | A1 * | 2/2005 | Jibbe | 714/6 |

* cited by examiner

*Primary Examiner* — Yuriy Semenenko
*Assistant Examiner* — Pete Lee
(74) *Attorney, Agent, or Firm* — Novak Druce Connolly Bove + Quigg LLP

(57) ABSTRACT

A connection assembly includes a connection member and a switch. The connection member includes a serial attached small computer system interface (SAS) connector electronically connected to the switch. When the switch is electronically connect to the motherboard, the switch transmits signals from the motherboard to a hard disk drive backplane via the SAS connector. When the switch is electronically connect to the hard disk drive backplane, the switch transmits signals from the hard disk drive backplane to the motherboard via the SAS connector.

9 Claims, 6 Drawing Sheets

CONNECTION ASSEMBLY AND ELECTRONIC DEVICE

BACKGROUND

1. Technical field

The disclosure generally relates to connection assemblies, and particularly to a connection assembly connecting a motherboard to a hard disk drive backplane of an electronic device.

2. Description of the Related Art

Electronic devices, such as servers, often employ a motherboard, a hard disk drive backplane, and a connection member connecting the motherboard to the hard disk drive backplane. The connection member includes a serial attached small computer system interface (SAS) connector, a serial advanced technology attachment (SATA) connector, and a cable connected therebetween. However, although the SAS connector is connected to both the motherboard and the backplane, the SAS connector can only receive data from the motherboard or the hard disk drive backplane, but not both. Thus, it is very inconvenient for operators to have to use two different connection members to connect the motherboard to the hard disk drive backplane to achieve communication in both directions when testing communication between the motherboard and the hard disk drive backplane.

Therefore, there is room for improvement within the art.

BRIEF DESCRIPTION OF THE DRAWINGS

Many aspects of an exemplary connection assembly and electronic device employing same can be better understood with reference to the following drawings. The components in the drawings are not necessarily drawn to scale, the emphasis instead being placed upon clearly illustrating the principles of the present embodiment.

DETAILED DESCRIPTION

Figure 3:
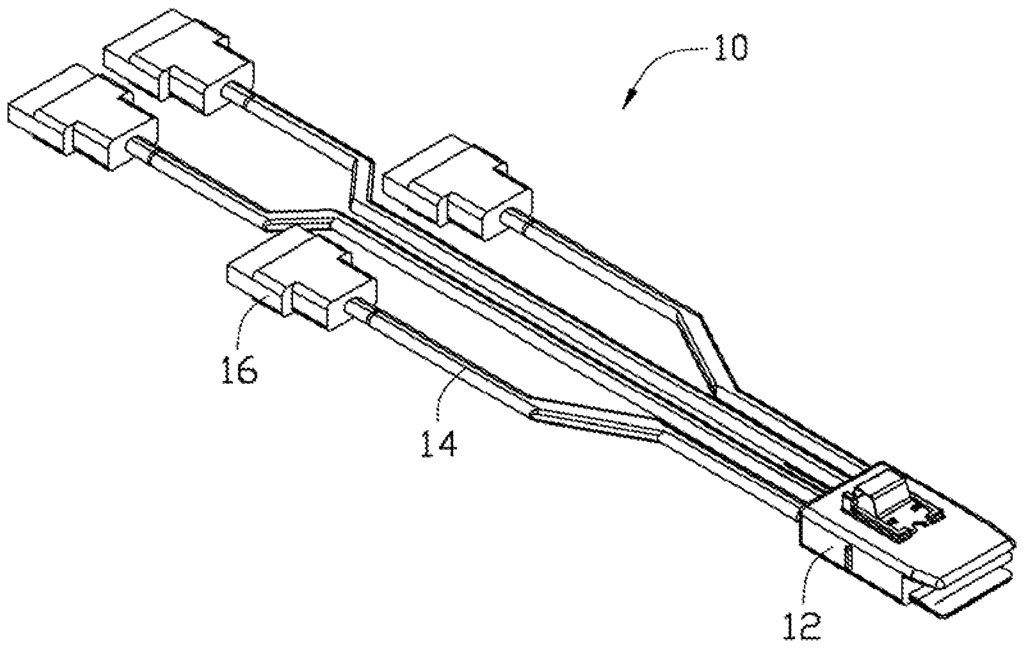
FIG. 3 is a schematic view of a connection member of a connection assembly of the electronic device, according to the exemplary embodiment.
Figure 4:
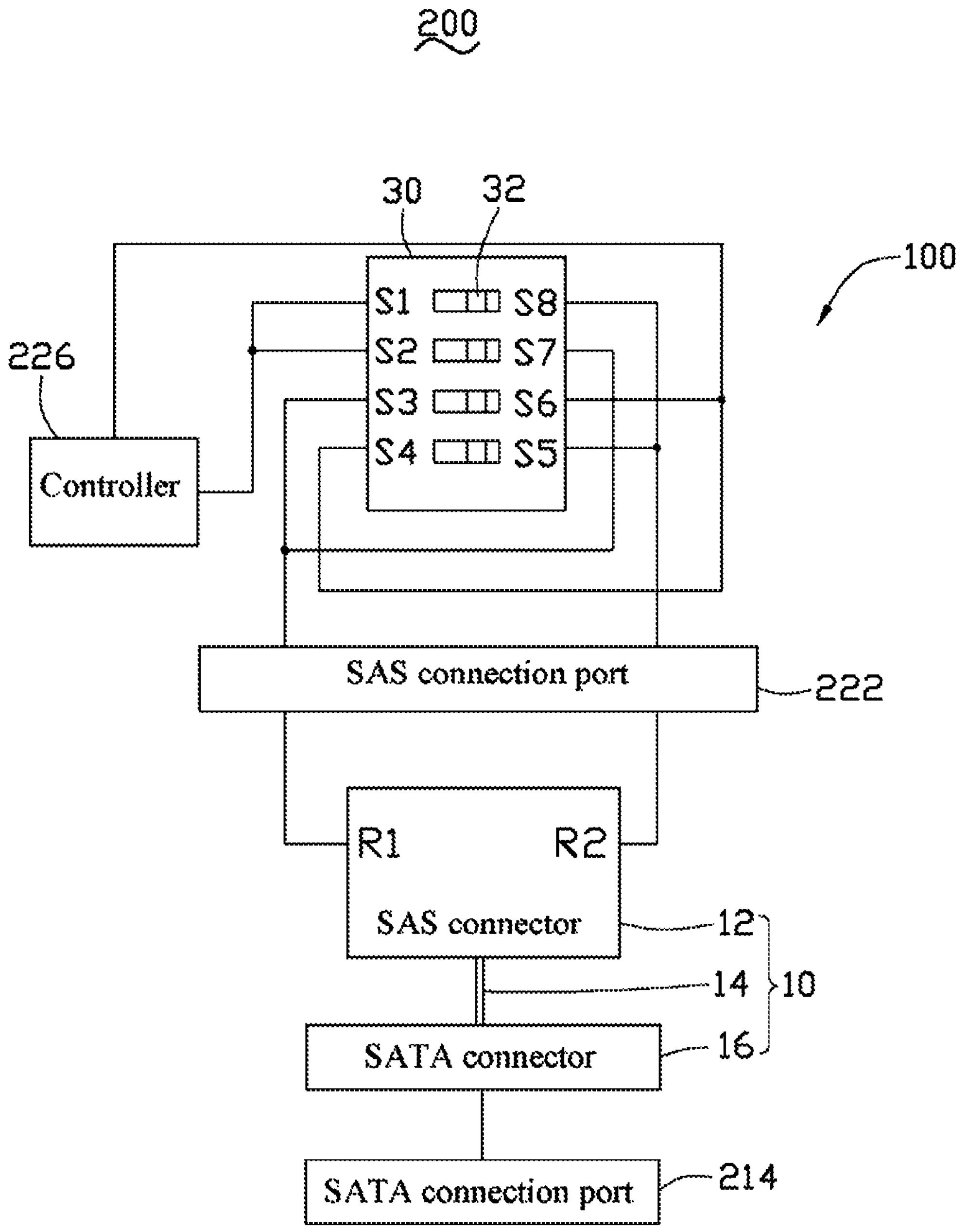
FIG. 4 is a circuit view of the electronic device where the switches are installed on the hard disk drive backplane.

FIGS. 3-4 show a connection assembly 100, according to an exemplary embodiment. The connection assembly 100 can be used in an electronic device 200, such as a server, for example.

Figure 1:
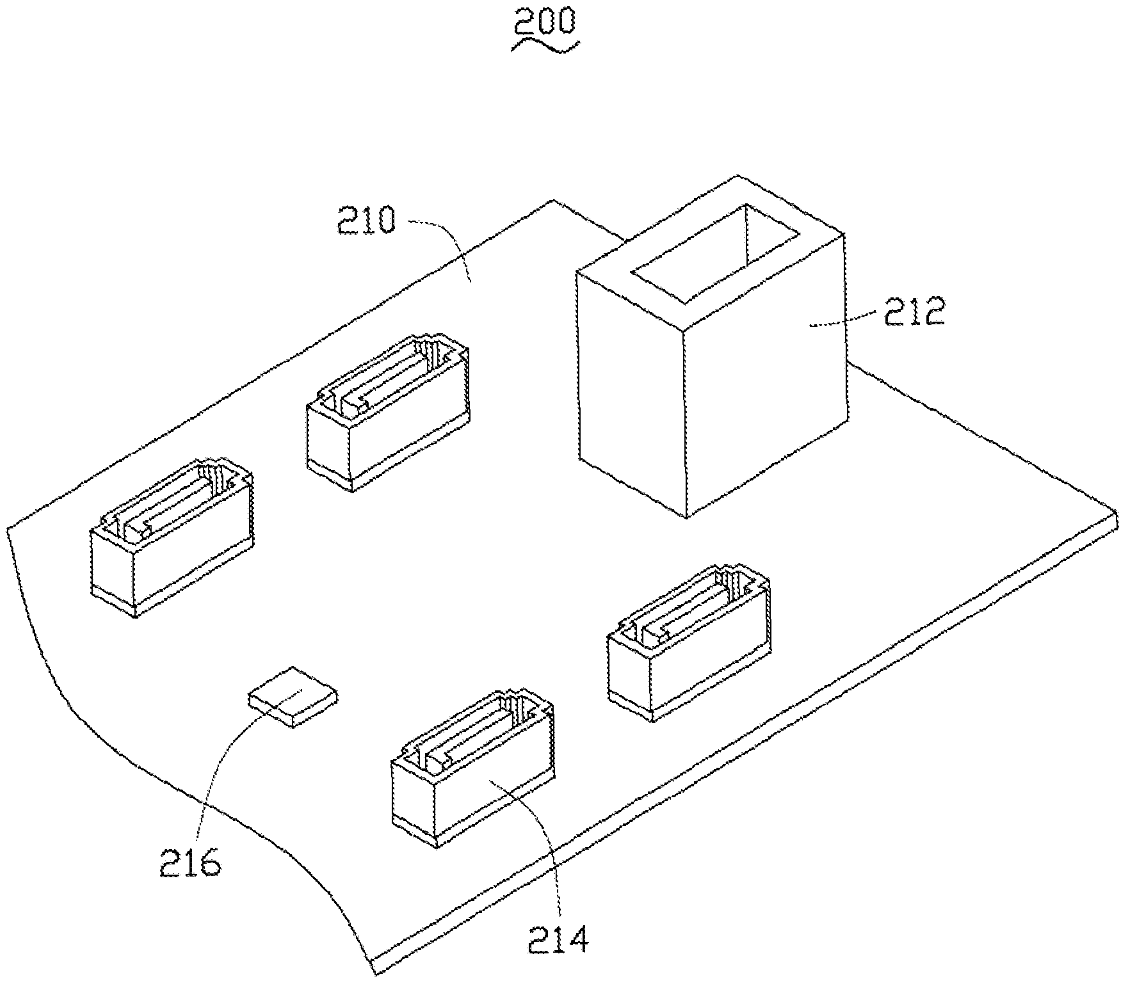
FIG. 1 is a schematic view of a motherboard of an electronic device, according to an exemplary embodiment.
Figure 2:
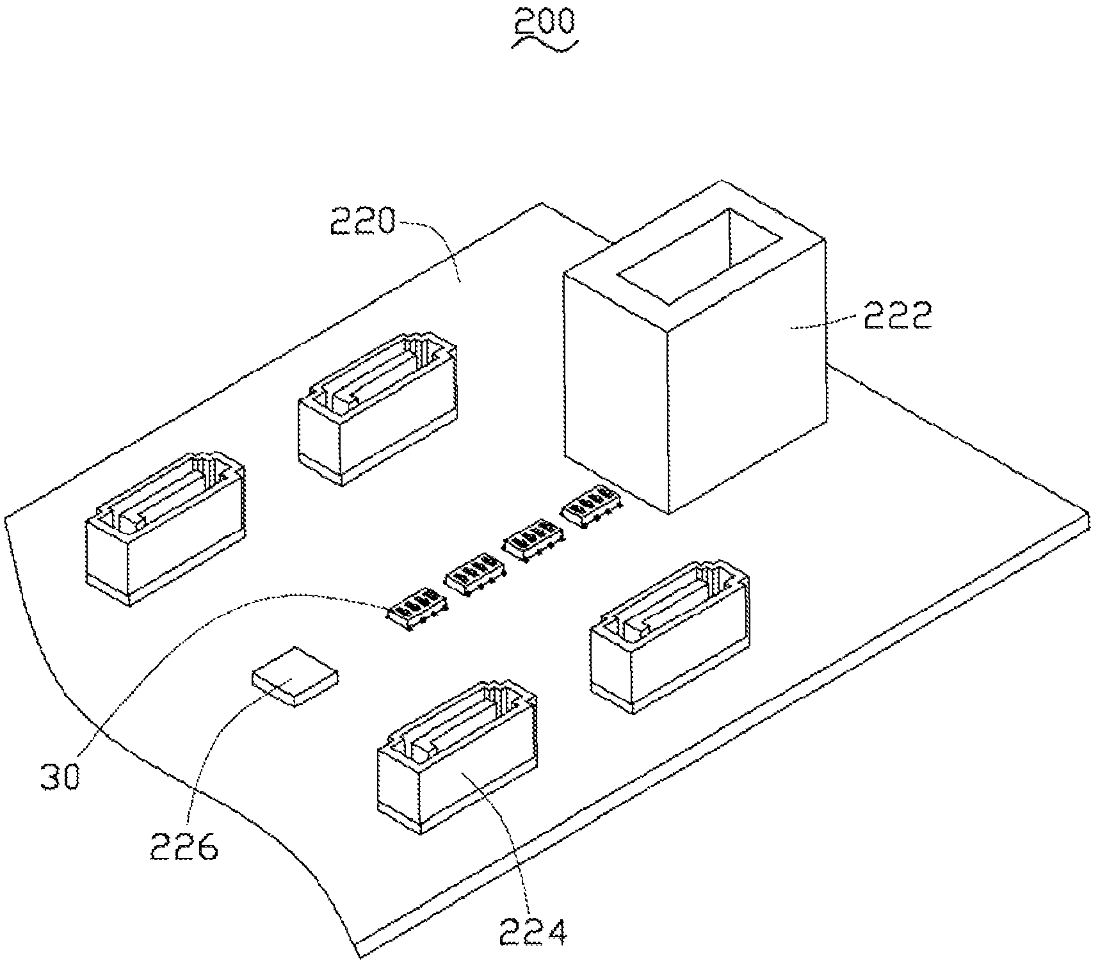
FIG. 2 is a schematic view of a hard disk drive backplane of the electronic device, the electronic device including a number of switches installed on the hard disk drive backplane, according to the exemplary embodiment.

Referring to FIGS. 1-2, the electronic device 200 further includes a motherboard 210 and a hard disk drive backplane 220. The motherboard 210 includes a SAS connection port 212, a number of SATA connection ports 214, and a controller 216. The hard disk drive backplane 220 includes an SAS connection port 222, a number of SATA connection ports 224, and a controller 226. Both the controllers 216, 226 can output first signals and second signals, and communication via the first signals and the second signals between the motherboard 210 and the hard disk drive backplane 220 can be enabled.

The connection assembly 100 connects the motherboard 210 to the hard disk drive backplane 220. The connection assembly 100 includes a connection member 10 and a number of switches 30.

The connection member 10 includes an SAS connector 12, a number of cables 14, and a number of SATA connectors 16. In one exemplary embodiment, both the number of the cables 14 and the SATA connectors 16 are four, and each SATA connector 16 is electronically connected to the SAS connector 12 via a cable 14. The SAS connector 12 is configured for connecting to the SAS connection port 212 of the motherboard 210 or the SAS connection port 222 of the hard disk drive backplane 220. The SATA connector 16 is configured for connecting to the SATA connection port 224 of the hard disk drive backplane 220 or the SATA connection port 214 of the motherboard 210, correspondingly.

Referring to FIG. 4, the SAS connector 12 includes at least one group of signal receiving/transmission pins. Each group of signal receiving/transmission pins includes a first pin R1 and a second pin R2. Both the first pin R1 and the second pin R2 can receive the first signals and the second signals from the controllers 216, 226, so that the SAS connector 12 can send the first signals and the second signals to the SATA connectors 16 via the cables 14.

Referring to FIGS. 2 and 4, in one exemplary embodiment, the number of the switches 30 is four. The four switches 30 can be installed on the hard disk drive backplane 220 or the motherboard 210, for transmitting the first signals and the second signals from the controller 226 or the controller 216 to the signal receiving/transmission pins of the SAS connector 12. The switch 30 is a toggle switch, and includes a first terminal S1, a second terminal S2, a third terminal S3, a fourth terminal S4, a fifth terminal S5, a sixth terminal S6, a seventh terminal S7, and an eighth terminal S8. The switch 30 further includes four switch toggles 32 (or levers, buttons, etc). The first terminal S1 can be electronically connected to/disconnected from the eighth terminal S8 by manipulation of one of the four switch toggles 32. The second terminal S2 can be electronically connected to/disconnected from the seventh terminal S7 by manipulation of one the four switch toggles 32. The third terminal S3 can be electronically connected to/disconnected from the sixth terminal S6 by manipulation of one of the four switch toggles 32. The fourth terminal S4 can be electronically connected to/disconnected from the fifth terminal S5 by manipulation of one of the four switch toggles 32.

Both the first terminal S1 and the second terminal S2 can be electronically connected to the controller 226 or the controller 216, to receive the first signals. Both the fourth terminal S4 and the sixth terminal S6 can be electronically connected to the controller 226 or the controller 216, to receive the second signals. The third terminal S3 and the seventh terminal S7 can both be electronically connected to the first pin R1 of the SAS connector 12 via the SAS connection port 212 or the SAS connection port 222, to transmit the first signals or the second signals to the SAS connector 12. The fifth terminal S5 and the eighth terminal S8 can both be electronically connected to the second pin R2 of the SAS connector 12 via the SAS connection port 212 or the SAS connection port 222, to transmit the first signals or the second signals to the SAS connector 12.

Referring to FIGS. 2 and 4, if the switches 30 are installed on the hard disk drive backplane 220, the SAS connector 12 is electronically connected to the SAS connection port 222 of the hard disk drive backplane 220, and the SATA connectors 16 are electronically connected to the SATA connection ports

214 of the motherboard 210. Operators manipulate the switch toggles 32 to allow the first terminal S1 to be electronically connected to the eighth terminal S8, the third terminal S3 to be electronically connected to the sixth terminal S6, the second terminal S2 to be disconnected from the seventh terminal S7, and the fourth terminal S4 to be disconnected from the fifth terminal S5. The first terminal S1 receives the first signals output from the controller 226, and the eighth terminal S8 outputs the first signals to the second pin R2 of the SAS connector 12 via the SAS connection port 222. The sixth terminal S6 receives the second signals output from the controller 226, and the third terminal S3 outputs the second signals to the first pin R1 of the SAS connector 12 via the SAS connection port 222. Then, the SAS controller 12 outputs the first signals and the second signals to the SATA connection ports 214 of the motherboard 210 via the cables 14 and the SATA connectors 16. Thus, effective communication between the hard disk drive backplane 220 and the motherboard 210 is enabled.

Figure 5:
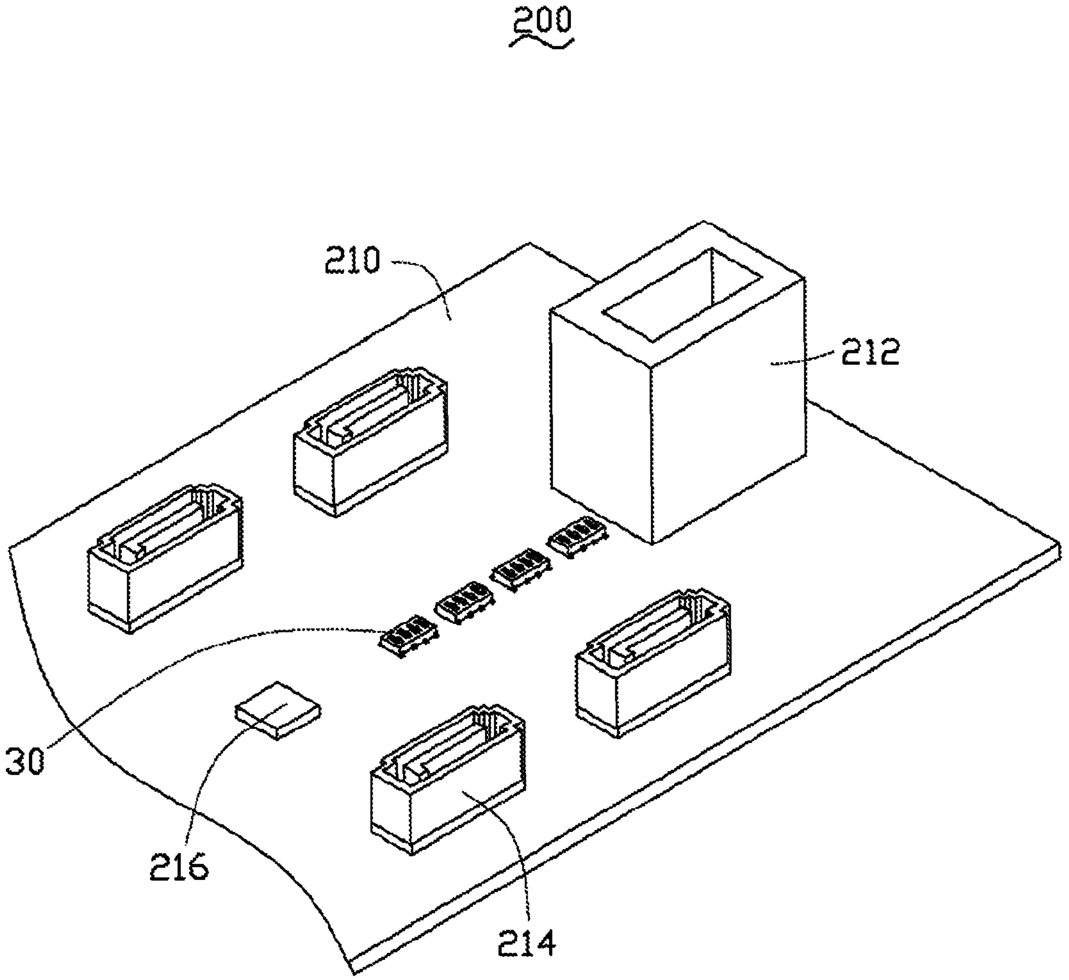
FIG. 5 is a schematic view of the motherboard of FIG. 1 where the switches are installed on the motherboard, according to the exemplary embodiment.
Figure 6:
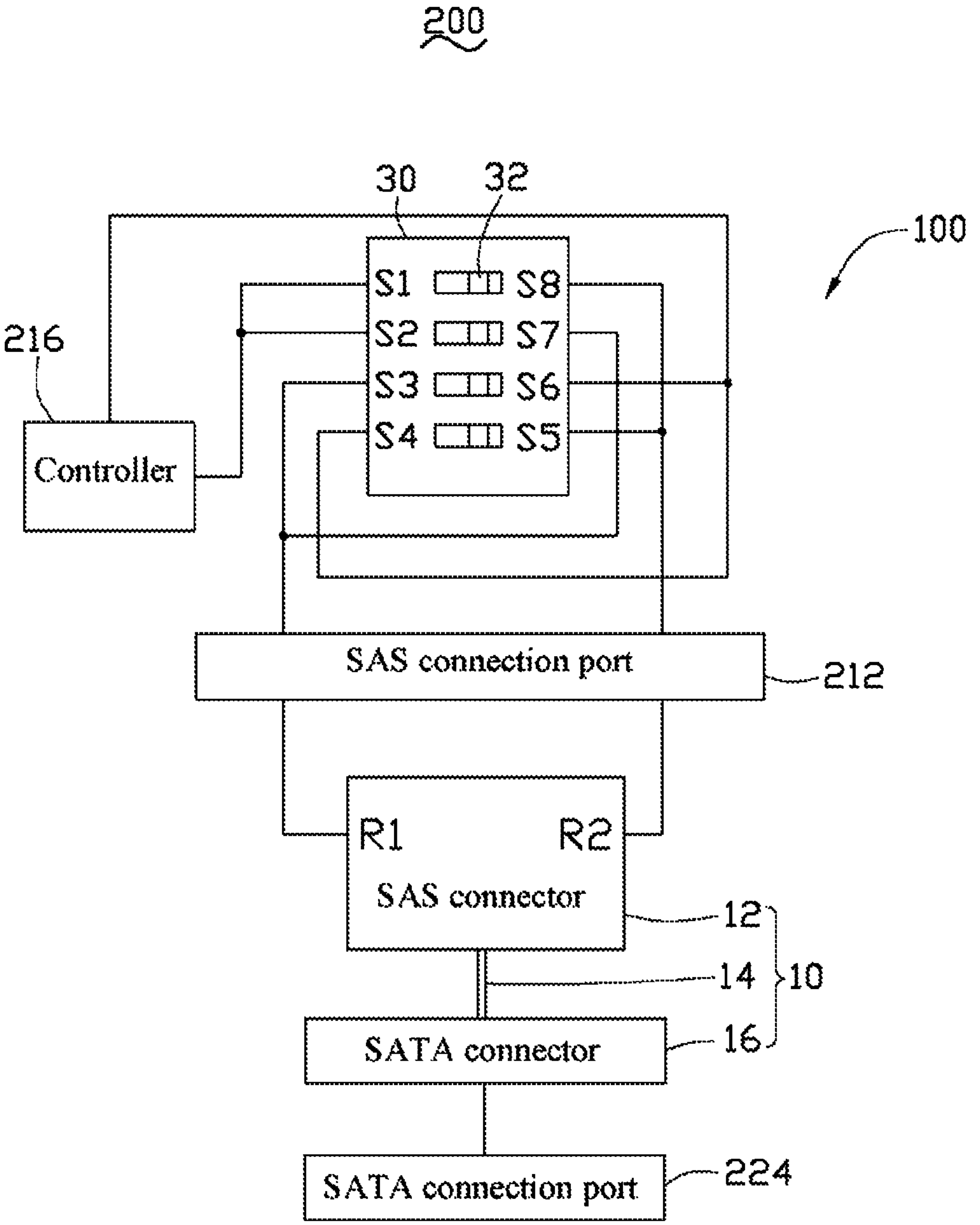
FIG. 6 is a circuit view of the electronic device where the switches are positioned on the motherboard.

Referring to FIGS. 5-6, if the switches 30 are installed on the motherboard 210, the SAS connector 12 is electronically connected to the SAS connection port 212 of the motherboard 210, and the SATA connectors 16 are electronically connected to the SATA connection ports 224 of the hard disk drive backplane 220. Operators manipulate the switch toggles 32 to allow the second terminal S2 to be electronically connected to the seventh terminal S7, the fourth terminal S4 to be electronically connected to the fifth terminal S5, the first terminal S1 to be disconnected from the eighth terminal S8, and the third terminal S3 to be disconnected from the sixth terminal S6. The second terminal S2 receives the first signals output from the controller 216, and the seventh terminal S7 outputs the first signals to the first pin R1 of the SAS connector 12 via the SAS connection port 212. The fourth terminal S4 receives the second signals output from the controller 216, and the fifth terminal S5 outputs the second signals to the second pin R2 of the SAS connector 12 via the SAS connection port 212. Then, the SAS controller 12 outputs the first signals and the second signals to the SATA connection ports 224 of the hard disk drive backplane 220 via the cables 14 and the SATA connectors 16. Thus, direct communication between the motherboard 210 and the hard disk drive backplane 220 is enabled.

The electronic device 100 includes the switches 30 installed on the motherboard 210 or the hard disk drive backplane 220. The switches 30 not only allow transmission of the first signals and the second signals from the controller 216 of the motherboard 210 to the SAS connector 12, but also can allow transmission of the first signals and the second signals from the controller 226 of the hard disk drive backplane 220 to the SAS connector 12. Thus, if the SAS connector 12 is connected to the motherboard 210 or the hard disk drive backplane 220, the motherboard 210 and the hard disk drive backplane 220 can interconnect and communication via the connection member 10 can be enabled in either direction, and a different connection member is not needed. Thus, the connection member 10 is universal, and the connection assembly 100 is efficient and convenient.

Although numerous characteristics and advantages of the exemplary embodiments have been set forth in the foregoing description, together with details of the structures and functions of the exemplary embodiments, the disclosure is illustrative only, and changes may be made in detail, especially in the matters of arrangement of parts within the principles of disclosure to the full extent indicated by the broad general meaning of the terms in which the appended claims are expressed.

What is claimed is:

1. A connection assembly for an electronic device, the electronic device comprising a motherboard and a hard disk drive backplane, the connection assembly comprising:

a connection member connecting the motherboard to the hard disk drive backplane, and comprising a serial attached small computer system interface (SAS) connector; and a switch installed on the motherboard or the hard disk drive backplane, and electronically connected to the SAS connector;

wherein the switch comprises a first terminal, a second terminal, a third terminal, a fourth terminal, a fifth terminal, a sixth terminal, a seventh terminal, an eighth terminal, and four switch toggles, the first terminal is connected to/disconnected from the eighth terminal by manipulation of one of the four switch toggles, the second terminal is connected to/disconnected from the seventh terminal by manipulation of one of the four switch toggles, the third terminal is connected to/disconnected from the sixth terminal by manipulation of one of the four switch toggles, the fourth terminal is connected to/disconnected from the fifth terminal by manipulation of one of the four switch toggles;

wherein the SAS connector comprises a first pin and a second pin, both the third terminal and the seventh terminal are electronically connected to the first pin of the SAS connector, and both the fifth terminal and the eighth terminal are electronically connected to the second pin of the SAS connector, signals from the motherboard or the hard disk drive backplane are output to the first pin via the third terminal and the seventh terminal, and signals from the motherboard or the hard disk drive backplane are output to the second pin via the fifth terminal and the eighth terminal;

wherein toggling of the switch to electronically connect to the motherboard causes the SAS connector to be electronically connected to the motherboard, and the signals from the motherboard to the hard disk drive backplane are sent via the SAS connector, and wherein toggling of the switch to electronically connect to the hard disk drive backplane causes the SAS connector to be electronically connected to the hard disk drive backplane, and the signals from the hard disk drive backplane to the motherboard are sent via the SAS connector.

2. The connection assembly as claimed in claim 1, wherein the switch is a toggle switch.

3. The connection assembly as claimed in claim 1, wherein both the first terminal and the second terminal are electronically connected to the motherboard or the hard disk drive backplane to receive the signals, and both the fourth terminal and the sixth terminal are electronically connected to the motherboard or the hard disk drive backplane to receive the signals.

4. The connection assembly as claimed in claim 1, wherein in response to toggling of the switch to electronically connect to the hard disk drive backplane, the first terminal connects to the eighth terminal, the third terminal connects to the sixth terminal, the second terminal disconnects from the seventh terminal, and the fourth terminal disconnects from the fifth terminal.

5. The connection assembly as claimed in claim 1, wherein in response to toggling of the switch to electronically connect to the motherboard, the second terminal connects to the seventh terminal, the fourth terminal connects to the fifth terminal, the first terminal disconnects from the eighth terminal, the third terminal disconnects from the sixth terminal.

6. The connection assembly as claimed in claim 1, wherein the connection member further includes a serial advanced technology attachment (SATA) connector, and a cable connected between the SAS connector and the SATA connector, the SAS connector outputs the signals to the motherboard or the hard disk drive backplane via the cable and the SATA connector.

7. An electronic device, comprising:

a motherboard;

a hard disk drive backplane;

a switch installed on the motherboard or the hard disk drive backplane;

a connection member electronically connecting the motherboard to the hard disk drive backplane; and wherein the switch comprises a first terminal, a second terminal, a third terminal, a fourth terminal, a fifth terminal, a sixth terminal, a seventh terminal, an eighth terminal, and four switch toggles, the first terminal is connected to/disconnected from the eighth terminal by manipulation of one of the four switch toggles, the second terminal is connected to/disconnected from the seventh terminal by manipulation of one of the four switch toggles, the third terminal is connected to/disconnected from the sixth terminal by manipulation of one of the four switch toggles, the fourth terminal is connected to/disconnected from the fifth terminal by manipulation of one of the four switch toggles;

wherein the SAS connector comprises a first pin and a second pin, both the third terminal and the seventh terminal are electronically connected to the first pin of the SAS connector, and both the fifth terminal and the eighth terminal are electronically connected to the second pin of the SAS connector, the third terminal and the seventh terminal output signals from the motherboard or the hard disk drive backplane to the first pin, and the fifth terminal and the eighth terminal output signals from the motherboard or the hard disk drive backplane to the second pin;

in response to toggling of the switch to electronically connect to the motherboard and electronically connected to the connection member, the switch transmits the signals from the motherboard to the connection member, and the connection member transmits the signals to the hard disk drive backplane; and in response to toggling of the switch to electronically connect to the hard disk drive backplane and electronically connected to the connection member, the switch transmits the signals from the hard disk drive backplane to the connection member, and the connection member transmits the signals to the motherboard.

8. The electronic device as claimed in claim 7, wherein the connection member includes a serial attached small computer system interface (SAS) connector, a serial advanced technology attachment (SATA) connector, and a cable connected between the SAS connector and the SATA connector, the SAS connector is electronically connected to the switch to receive the signals, and outputs the signals to the motherboard or the hard disk drive backplane via the cable and the SATA connector.

9. The electronic device assembly as claimed in claim 8, wherein both the first terminal and the second terminal are electronically connected to the motherboard or the hard disk drive backplane to receive the signals, and both the fourth terminal and the sixth terminal are electronically connected to the motherboard or the hard disk drive backplane to receive the signals.

* * * * *